United States Patent [19]

Comey et al.

[11] Patent Number: 4,814,620

[45] Date of Patent: Mar. 21, 1989

[54] TILTED ARRAY WITH PARALLEL COLD SHIELD

[75] Inventors: David M. Comey, Concord; Brian W. Denley, Melrose; William J. White, Chelmsford, all of Mass.

[73] Assignee: Honeywell Inc., Minneapolis, Minn.

[21] Appl. No.: 127,077

[22] Filed: Dec. 1, 1987

[51] Int. Cl.$^4$ .................................................. G01J 5/06
[52] U.S. Cl. ..................................... 250/352; 250/349
[58] Field of Search ..................... 250/352, 338.1, 349, 250/332

[56] References Cited

U.S. PATENT DOCUMENTS

| | | | |
|---|---|---|---|
| 4,446,372 | 5/1984 | Gurnee | 250/352 |
| 4,609,820 | 9/1986 | Miyamoto | 250/352 |
| 4,675,525 | 6/1987 | Amingual et al. | 250/332 |

FOREIGN PATENT DOCUMENTS 60-50426  3/1985  Japan ................................... 250/352

Primary Examiner—Carolyn E. Fields
Assistant Examiner—John A. Miller
Attorney, Agent, or Firm—Kinney & Lange

[57] ABSTRACT

A cold shield for an array of detectors of predetermined shape comprising a first cover of radiation blocking material formed with parallel rows of apertures and lying a first distance away from the detectors and a second cover of radiation blocking material formed with a plurality of apertures of generally the predetermined shape therethrough and lying a second distance, smaller than the first distance, away from the detectors so as to minimize background radiation from reaching the detectors while permitting desired radiation approaching the array from any of a plurality of angles to reach the detectors.

15 Claims, 2 Drawing Sheets

TILTED ARRAY WITH PARALLEL COLD SHIELD

BACKGROUND OF THE INVENTION

1. Field of the Invention

The present invention relates to a parallel cold shield for reducing undesirable background radiation from reaching detectors so as to enhance the detector response to radiation within its intended field of view. More particularly, the invention relates to a cold shield for a tiltable array of infrared detectors whose sensitivity decreases with the amount of background radiation received but which receive radiation from any of a plurality of directions.

2. Description of the Prior Art

Cold shields for use in limiting background radiation for infrared detector arrays are common in the prior art. For example, in U.S. Pat. No. 3,963,926 to Sebastian R. Borrello issued June 15, 1976, a thermal energy receiver is disclosed which employs a cold shield through which apertures for each detector are formed. The detectors only receive energy generated within a solid angle subtended by the optical elements. A difficulty encountered in the Borrello patent was that the cold shield had limited effectiveness in high density two-dimensional arrays common in modern day infrared systems. In the William J. White U.S. Pat. No. 4,576,679 issued Mar. 18, 1986, and assigned to the assignee of the present invention, a shield which overcomes that problem in the Borrello patent is disclosed involving etching of glass apertures and positioning the aperture edges in a predetermined relationship with the edges of the detectors to thereby shield the detectors from radiation generated outside the field of view of the optical system.

Both the Borrello and White disclosures have the difficulty that the shield and detector array need to be in a predetermined positional relationship, generally perpendicular, to the optic axis of the field of view. If the array were to be tilted with respect to the optical axis, an edge of the cold shield would cut off part of the desired field of view and the effectiveness of the array would be diminished. This difficulty arises in the prior art because the cold shield has been an individual aperture located just above each of the detectors and of a shape such that energy can be received on the detectors only from a predetermined cone of view. Thus, when the array is tilted at least one edge of the aperture moves into the cone of view and begins blocking radiation the detector should receive for best sensitivity.

SUMMARY OF THE INVENTION

In the present invention, the difficulties with the prior art are overcome by incorporating an aperture above the detectors which is comprised of two separate cover elements. A first cover element comprises one or more layers of light blocking material with apertures therethrough located just above the detectors and of the same general shape as the detectors. A second cover element is shown comprising one or more layers of light blocking material having parallel and elongated apertures therethrough and located more remote from the detectors than the first cover. In the preferred embodiment, the two covers are deposited on opposite sides of a body of transparent material. Thus, when the array is tilted, radiation can reach the detectors without limiting the field of view because the parallel rows permit the introduction of a tilt without an edge causing the radiation to be blocked within the field of view. A third aperture is formed as a slot in the container housing the array and, by proper positioning of the three apertures, most of the off axis background radiation can be prevented from reaching the detectors.

DETAILED DESCRIPTION OF THE PREFERRED EMBODIMENTS

Figure 1:
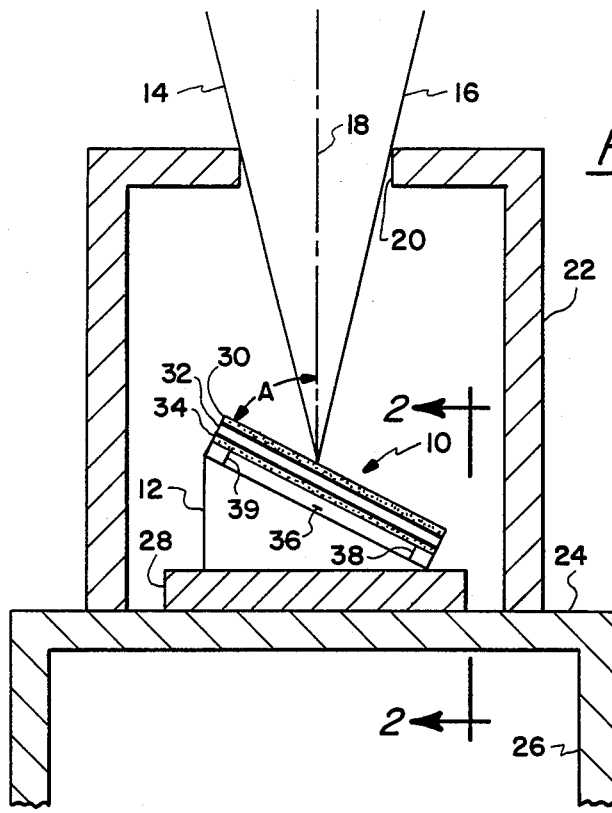
FIG. 1 is a cross-sectional view of an array tilted with respect to the optic axis plane and employing the cold shield of the present invention.

In FIG. 1, a detector and cold shield array 10 is shown mounted on a wedge shaped mounting member 12 so as to receive radiation from a remote object in a field of view defined by lines 14 and 16 generally along an optic axis plane 18 through an elongated slot opening 20 in a cold shield box 22 mounted on the end 24 of a dewar end well 26. Wedge shaped mounting member 12 and array 10 are within the interior of cold shield box 22 and are also mounted on the end 24 of the dewar end well 26 by a carrier board 28. It is seen that the optic axis plane 18 of the incoming radiation arrives at the tilted array 10 at an acute angle A which is considerably less than 90 degrees. In one preferred embodiment, angle A is 67 degrees and, in the prior art, some of the radiation that is arriving through the opening 20 within the desired field of view would be blocked by the edges of the aperture of the cold shield.

Array 10 is comprised of a first cover or coating of material 30, preferably formed by multiple layers of light blocking film deposited on the upper surface of an infrared transparent block or base 32 with apertures therethrough arranged in a parallel pattern better seen in the other figures. Array 10 also includes a second cover of material 34, preferably formed like the first coating on the under side of transparent block 32 with apertures therethrough arranged to be generally of the same shape as a plurality of detectors 36 which comprise a row extending into the plane of FIG. 1. Detectors 36 lie just above the slanted edge of wedge 12 and are spaced slightly below the underneath edge of cover 34 by spacer members 38 and 39 so that each detector in an array can "see" the remote scene within the field of view generated along optic axis plane 18 but not receive radiation outside such field of view as will hereinafter be explained in more detail.

The transparent block of material 32 is, in the preferred embodiment, zinc sulfide which is transparent to infrared radiation and to visible light also, which allows the array to be aligned visibly by an operator. Alternately, block 32 may be germanium, which is transparent to infrared radiation but is not transparent to visual radiation so that aligning by other means is required. The light blocking covers 30 and 34 are usually referred to as "dark mirror coatings" which have one surface that is reflective to infrared radiation and a second surface that is absorptive of infrared radiation. In the figures, the reflective surface of these coatings is shown by dotted areas and the absorptive surfaces are shown as solid black or heavily shaded areas. It is seen that the reflective surface of covers 30 and 34 face outward from the block 32 while the absorptive surfaces face inward. By facing in, the absorptive surfaces reduce diffuse reflections from the array, from openings in the coatings and from various other optically reflective surfaces in the system. To further reduce such reflections, the upper and lower surfaces of transparent block 32 have an antireflection coating applied thereto which further operates to maximize transmission through the material. The reflective surfaces of covers 30 and 34 block radiation by reflecting it away from the detectors into the interior of cold shield box 22.

Figure 2:
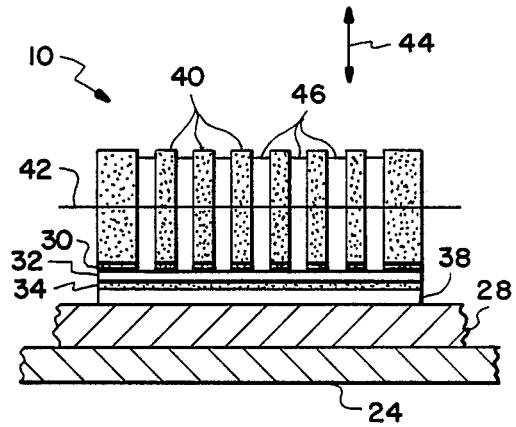
FIG. 2 is a view of FIG. 1 taken along lines 2—2.

FIG. 2 is a view of the array 10 of FIG. 1 as seen along lines 2—2. It is seen that the upper cover 30 of material is formed in a plurality of parallel rows, such as are identified by reference numeral 40, and that they lie parallel to the plane of FIG. 1 so that radiation entering through slot 20 illuminates all of the rows simultaneously with the desired field of view around optic axis plane 18 falling approximately along a line shown in FIG. 2 by reference numeral 42. It should be understood, however, that radiation traveling along optic axis plane 18 of FIG. 1 may be just one static position of a moving sweep of radiation as, for example, when the field of view is being observed by a rotatable mirror. In this latter event, the optic axis plane 18 of FIG. 1 will move with rotation of the mirror in the plane of FIG. 1. In FIG. 2, this direction of scan is shown by arrow 44 and it will be noted that line 42 will thus move up and down in FIG. 2 depending upon the position of the rotatable mirror of the optical system. It will also be noted that with the scan motion in the direction of arrow 44, radiation can pass in between the radiation blocking partitions 40 as seen, for example, by reference numeral 46 so as to enter into the base transparent material 32 regardless of the direction that optic axis plane 18 assumes. Furthermore, it will be observed that this condition continues for any tilt of the array 10, including when the optic axis plane is perpendicular to the array. Thus, tilting of the array does not effect any blocking of the radiation passing through aperture 20 in the direction shown by arrow 44, although the individual reflective surfaces of parallel elements 40 will block off-angle radiation perpendicular to direction 44.

Figure 3:
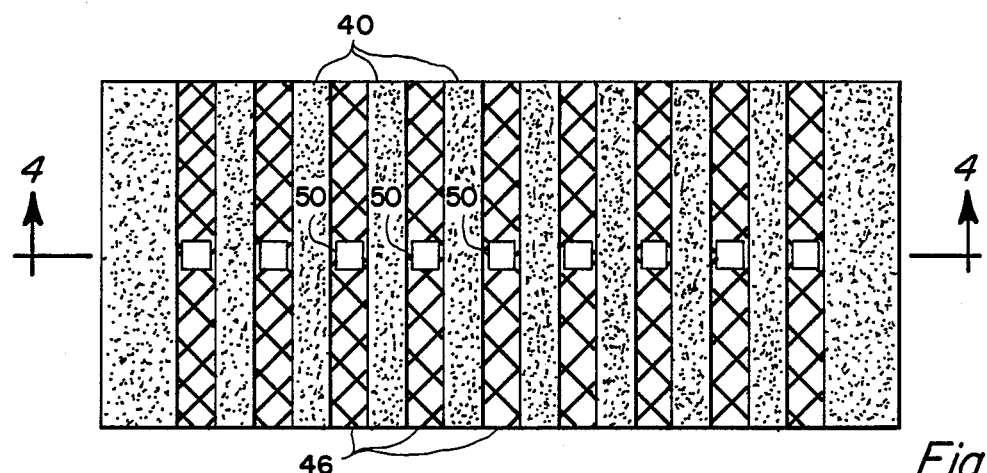
FIG. 3 is a top view of the cold shield of the present invention.

If slot 20 and the parallel light blocking partitions 40 were the only cold shield radiation blockers in the system, then undesirable off axis or background radiation could still enter into the system through the slots between the partitions 40. In order to block this undesirable off axis radiation, the underneath cover 34 is formed with apertures that are basically the same shape as the detectors usually rectangular) and which are located a small distance above the detectors as compared with the partitions 40 in the upper surface. FIG. 3 shows the rectangular apertures, such as seen at reference numeral 50, as seen through the parallel apertures such as 46 between the reflective partitions 40 of the array 10. It is seen that outside of the upper and lower edges of each aperture 50 radiation will be blocked in a vertical direction in FIG. 3 from reaching the detectors lying underneath the apertures. Since apertures 50 are relatively close to the detectors 36 as seen in FIG. 1, radiation coming thereto through a relatively small band of different angles will still arrive at the detectors but radiation coming at widely various angles as, for example, from reflections interior to the cold shield supporting box 22 or from way off axis in through aperture 20 thereof, will be blocked by the cover 34 and will not reach the detectors.

Figure 4:
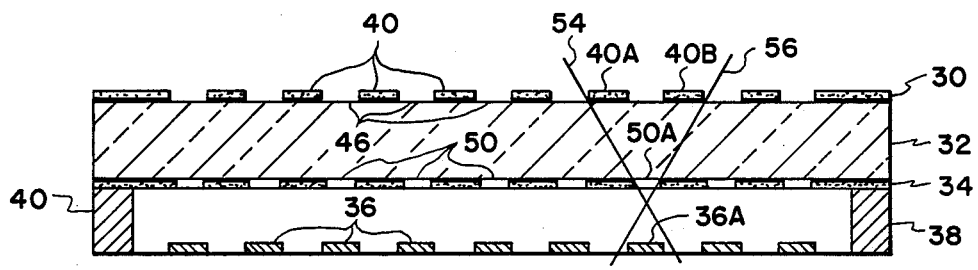
FIG. 4 is a cross-sectional view of FIG. 3 taken along lines 4—4.

The radiation blocking properties of the cold shield covers 30 and 34 can be better seen in FIG. 4 which is a view of FIG. 3 taken along lines 4—4. It will be understood that slot 20 has already blocked most of the background radiation, but some will still enter through slot 20 and reach array 10. In FIG. 4, the parallel slots 46 between the reflecting partitions 40 of cover 30 and the apertures 50 in the lower cover 34 are shown to be situated on opposite sides of the infrared transparent block 32. The detectors 36 are shown located beneath the lower surface of coating 34 by a distance which prevents cross over radiation from one of the parallel apertures from striking an adjacent detector. More particularly, the spacers 38 and 40 are arranged at such a distance, and the base is of such thickness, that a ray of energy 54 just missing the left edge of a first reflective partition 40A, and just entering the left edge of an aperture 50A, will miss a detector 36A. Likewise, a ray of energy 56 just missing the right edge of a partition 40B, and just passing through the right edge of the aperture 50A, will also miss detector 36A. Rays at greater angles than 54 and 56 will possibly strike more remote detectors, but this is a very minor amount of the background radiation. Thus it is seen that radiation traveling at various angles through the apertures 46 will not strike the detectors 36 between one aperture and the detectors lying beneath an adjacent aperture. Nevertheless, the partitions such as 40A will not block desirable radiation coming in at desired view angles in a plane perpendicular to FIG. 4 generally along optic axis plane 18, but will block radiation coming too far off axis in this direction.

Figure 5:
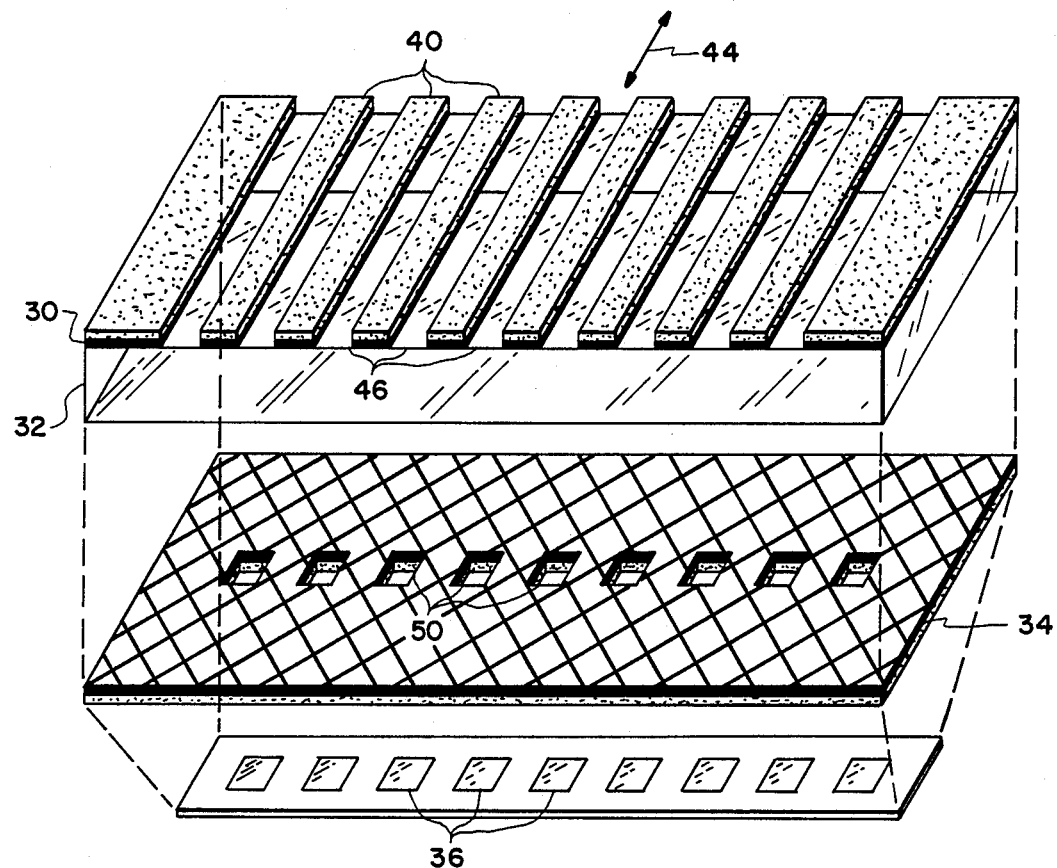
FIG. 5 is a perspective view of the cold shield of the present invention.

For a better understanding of the construction of the array 10, reference may be had to the perspective and exploded view seen in FIG. 5. In FIG. 5, the infrared transparent block 32 is shown having the upper dark mirror coating 30 formed thereon with the dark absorptive layer facing downward and the dotted reflective layer facing upward. The parallel slots 46 are seen between the parallel rows of light blocking material 40 so that infrared energy can pass into block 32 in any angular direction following the scan direction 44, but will be blocked for angles greater than a predetermined value in directions perpendicular to scan direction 44 by slot 20.

The lower dark mirror coating 34 is seen in FIG. 5 in an exploded view downwardly from transparent block 32, but in actual assembly would be flush with the lower surface of block 32. As seen in FIG. 5, the apertures 50 through the lower dark mirror coating 34 block radiation which comes in at too varying an angle from perpendicular in the direction of the scan 44, but since they are located closer to the detectors 36, a greater variation in the angle is permitted. FIG. 5 shows the detectors 36 in exploded fashion below the lower coating 34, but in actual practice will be spaced from this lower coating 34 by a distance dependent on the height of spacers 38 and 40 (not shown in FIG. 5 for clarity).

It is thus seen that by cooperation between the slot 20, the upper parallel apertures 46 and the lower apertures 50, the detectors 36 are shielded from background radiation in a way which permits the array 10 to be tilted with respect to the optic axis plane of the radiation coming from the remote scene. Thus, the sensitivity of the detectors will be increased since the amount of background radiation the detectors receive will be substantially decreased.

While I have shown in the above description nine detectors and their associated apertures, it should be realized that the actual number of detectors found in an infrared detector array is usually between 50 and 200. Furthermore, while I have shown apertures 50 and detectors 36 to be rectangular in configuration, it will be realized that other configurations for the apertures and detectors are entirely possible.

Although the present invention has been described with reference to preferred embodiments, workers skilled in the art will recognize that changes may be made in form and detail without departing from the spirit and scope of the invention.

What is claimed is:

1. Radiation cold shield apparatus comprising:
    a plurality of radiation detectors having a predetermined shape;
    a first layer of radiation blocking material positioned a first distance above the detectors and having a plurality of first apertures of substantially the predetermined shape, each aperture being located over one of the detectors to permit radiation to reach the detector throughout a field of view defined by the edges of the aperture; and
    a second layer of radiation blocking material positioned a second distance greater than the first distance above the detectors and having a plurality of second apertures arranged in parallel rows extending in a first direction to permit radiation to pass through to the first layer at angles unlimited by the second in planes parallel to the rows but limited by the edges of the second apertures in planes perpendicular to the rows.

2. Apparatus according to claim 1 wherein the first and second layers are coatings on opposite sides of a radiation transparent block of material of predetermined thickness.

3. Apparatus according to claim 1 wherein the first and second layers are dark mirror coatings having a radiation reflecting side and a radiation absorbing side with the radiation absorbing sides facing each other.

4. Apparatus according to claim 2 wherein the first and second layers are dark mirror coatings having a radiation reflecting side and a radiation absorbing side with the radiation absorbing sides being adjacent the opposite sides of the block.

5. Apparatus according to claim 1 wherein the radiation is infrared and the detectors are infrared detectors.

6. Apparatus according to claim 4 wherein the radiation is infrared, the detectors are infrared detectors and the block of material is transparent to infrared radiation.

7. Apparatus according to claim 6 wherein the block of material is also transparent to visible radiation.

8. Apparatus according to claim 1 wherein the radiation reaches the detectors generally along an optic axis plane and means are provided to position the plurality of detectors in a plane at an acute angle to the optic axis plane.

9. Apparatus according to claim 8 further including a radiation shielding box surrounding the first and second layers of material and the detectors, the box having a slot positioned a third distance greater than the second distance above the detectors and arranged to permit radiation to enter the box through a limited angle.

10. Apparatus according to claim 9 wherein the radiation is infrared and the box is mounted on a dewar.

11. Apparatus according to claim 1 wherein the first and second distances are chosen so that radiation passing in a line through one of the parallel rows of apertures and through any aperture in the second layer other than that directly beneath the one row passes between detectors.

12. The method of making a cold shield for a plurality of infrared detectors of predetermined shape mounted in a first plane comprising the steps of:
    A. coating a block of infrared transparent material on a first side with a first light blocking material;
    B. forming a plurality of first apertures in the first light blocking material, each generally of the predetermined shape;
    C. coating the block on a second side with a second light blocking material;
    D. forming a plurality of elongated parallel rows of second apertures in the second light blocking material, each row positioned generally directly above one of the first apertures; and
    E. mounting the block above the detectors to permit radiation to reach the detectors through a first angle defined by the edges of the first apertures and in a first direction defined by the edges of the parallel rows of second apertures but inhibited by the parallel rows of apertures in a direction perpendicular to the first direction.

13. The method of claim 12 wherein the coating of first and second materials produces an infrared absorbing surface adjacent the block of infrared transparent material and an infrared reflecting surface adjacent the infrared absorbing surface.

14. The method of claim 13 wherein the block is mounted at such a distance from the detectors that radiation, passing through one of the parallel rows of second apertures and through one first aperture in the first material which is adjacent another first aperture directly below the one of the parallel rows of second apertures, passes between the detectors.

15. The method of claim 12 wherein the radiation passes to the detectors generally along a first axis plane where means are provided to position the detectors in the first plane at an acute angle to the first axis plane.

* * * * *

UNITED STATES PATENT AND TRADEMARK OFFICE
CERTIFICATE OF CORRECTION

PATENT NO. : 4,814,620

DATED : March 21, 1989

INVENTOR(S) : David M. Comey et al.

It is certified that error appears in the above-identified patent and that said Letters Patent is hereby corrected as shown below: Title page:

Add the folowing United States Patents to the References Cited Section:

| | | | |
|---|---|---|---|
| 3,963,926 | 6/1976 | Borrello | 250/338 |
| 4,576,679 | 3/1986 | White | 156/644 |

Column 5, line 33 after "second", insert --apertures--.

Signed and Sealed this

Thirty-first Day of October, 1989

Attest:

DONALD J. QUIGG

Attesting Officer

Commissioner of Patents and Trademarks